March 10, 1970 J. S. LAMMING 3,500,143

HIGH FREQUENCY POWER TRANSISTOR HAVING DIFFERENT RESISTIVITY BASE REGIONS

Filed July 21, 1967 8 Sheets-Sheet 1

INVENTOR.
JACK STEWART LAMMING

BY Frank R. Jrifari
AGENT

INVENTOR.
JACK STEWART LAMMING
BY
Frank R. Trifari
AGENT

INVENTOR.
JACK STEWART LAMMING
BY
Frank R. Trifari
AGENT

INVENTOR.
JACK STEWART LAMMING
BY
AGENT

INVENTOR.
JACK STEWART LAMMING
BY
Frank R. Trifari
AGENT

INVENTOR.
JACK STEWART LAMMING
BY
Frank R. Trifari
AGENT

INVENTOR.
JACK STEWART LAMMING
BY
Frank R. Trifari
AGENT

INVENTOR.
JACK STEWART LAMMING
BY
Frank R Trifari
AGENT

United States Patent Office 3,500,143
Patented Mar. 10, 1970

3,500,143

HIGH FREQUENCY POWER TRANSISTOR HAVING DIFFERENT RESISTIVITY BASE REGIONS

Jack Stewart Lamming, Watford, England, assignor, by mesne assignments, to U.S. Philips Corporation, New York, N.Y., a corporation of Delaware Filed July 21, 1967, Ser. No. 655,218
Claims priority, application Great Britain, July 25, 1966, 33,426/66
Int. Cl. H01l 3/00, 5/00, 7/00
U.S. Cl. 317—235 17 Claims

ABSTRACT OF THE DISCLOSURE

A high frequency, high power transistor of the planar type wherein the base region underlying the emitter comprises a first central part of higher resistivity and a second outer part of lower resistivity which extends to the surface and to which the base contact is made. The result, through the use of current crowding, is to reduce the effective emitter width while permitting a relatively wide emitter contact thereby improving the high frequency performance of the device. In another embodiment, interdigital emitter and base contacts are arranged, and the active base region is surrounded by a deeper diffused peripheral region.

Figure 1:
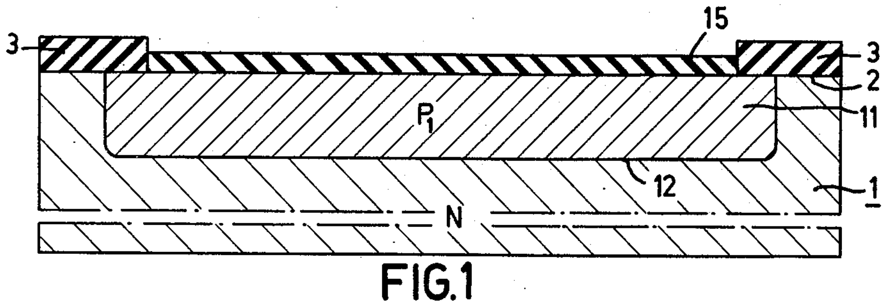
Figure 2:
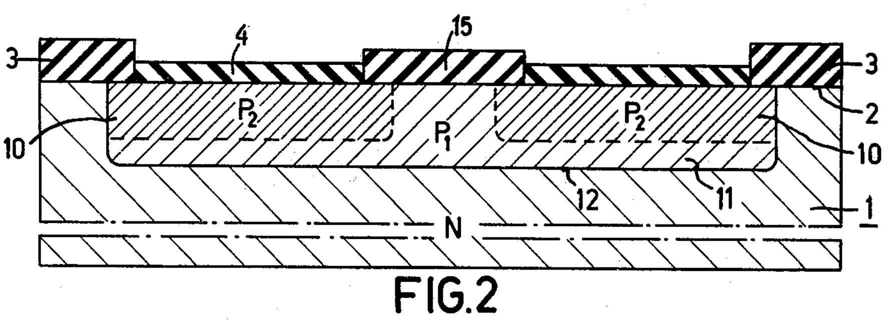

This invention relates to transistors, particularly but not exclusively to high frequency high power transistors, comprising a semiconductor body or body part mainly of one conductivity type in which a collector region of the one conductivity type is situated, a diffused emitter region of the one conductivity type extending from one substantially plane surface of the body or body part and surrounded within the body or body part by a diffused base region of the opposite conductivity type, an adherent protective insulating layer on the one surface and ohmic contacts in openings in the insulating layer to the emitter region and the base region where these regions extend to the one surface. The invention further relates to methods of manufacturing such transistors.

Transistors of the above-mentioned kind in which the collector-base junction also extends to the one surface below the insulating layer are generally referred to as planar transistors.

The manufacture of a planar transistor generally involves the formation of an adherent protective insulating layer on one plane surface of a semiconductor body of one conductivity type, the diffusion of a conductivity type determining impurity element characteristic of the opposite conductivity type to which the insulating layer is impervious into a first surface portion of the body exposed by a first opening made in the insulating layer to form a base region of the opposite conductivity type, the subsequent diffusion of a conductivity type determining impurity element characteristic of the one type to which the insulating layer is impervious into a second surface portion exposed by a second opening made in the insulating layer, which is completely internal to the first surface portion previously exposed by the first opening, to form an emitter region of the one conductivity type completely internal to the base region, the formation of further openings in the insulating layer to expose at least the emitter and base regions where they extend to the surface and the deposition of ohmic contact material in these further openings. Generally during and/or subsequent to each diffusion step a fresh insulating layer is formed in the respective opening which latter formed insulating layer in each case adjoins and is contiguous with the insulating layer initially present.

The formation of openings in the insulating layer is carried out with the aid of photoprocessing techniques, that is using photoresist materials, masking and etching techniques, to selectively remove parts of a photoresist layer on the surface of the insulating layer and thus by using suitable etching liquids to selectively remove corresponding parts of the insulating layer.

It is frequently desired to manufacture transistors having a relatively small geometry to obtain a high frequency response. One of the main limitations on the reduction of the transistor geometry to the desired optimum size lies in the limitations imposed by the capabilities of the photoprocessing techniques. There exists a limit on the size of an opening which can be formed reproduceably in the insulating layer. Furthermore each photoprocessing step necessitates the dimensional and registration tolerances of the associated masing step to be confined within extremely precise limits.

In the operation of a transistor with a forward base drive $I_B > O$ there occurs a transverse voltage drop across the base region associated with the flow of base current. If the external emitter voltage is assumed to be applied uniformly over the whole emitter-base junction, the effect of the transverse voltage drop is to reduce the potential difference applied to the portion of the emitter-base/junction situated furthest away from the base contact. This portion of the emitter-base junction in a planar transistor is the central portion of the part of the emitter-base junction lying parallel to the plane surface. With increasing base current a crowding of the current towards the part of the emitter-base junction nearest the base contact occurs. The current crowding effect is dependent, inter alia, on the resistivity of the base region since with a higher resistivity base region a higher transverse voltage drop will occur for a given current.

In planar transistors the current crowding effect is an important consideration when it is desired to construct high power devices. To obtain the desired characteristics of such devices it is necessary due to the said crowding effect to have a large periphery to area ratio for the emitter. One approach to the obtainment of a large emitter periphery to area ratio is to form a comb-like emitter region with an interdigitated electrode system for the base and emitter contacts. Alternatively an interdigitated electrode system may consist of a plurality of parallel situated separate emitter regions, for example of rectangular outline, which are interconnected by emitter ohmic contact fingers which are interdigited with base ohmic contact fingers. A further approach to the obtainment of a large emitter periphery to area ratio is to form a large plurality of very small closely spaced emitter regions, for example of circular outline, which are interconnected by a metal layer extending in openings in the insulating layers exposing the emitter regions where they extend to the surface and overlaying the insulating layer between adjacent emitter sites. See for example, "Electronics" Aug. 23, 1965, pages 70 to 84.

For high frequency of operation of a transistor it is necessary that the emitter to collector signal delay time, $\tau_{ec}$ is small since $$\tau_{ec} \simeq \frac{1}{2\pi f T}$$

where $f_T$ is the frequency at which the grounded emitter current gain is equal to unity. To achieve a small $\tau_{ec}$ necessitates a very narrow base width, for example a base width of a few tenths of a micron. This in turn generally necessitates the use of shallow emitter and base diffusions. As has been previously stated the required emitter periphery must be obtained using the minimum emitter area. Furthermore this emitter area must be contained within a minimum base area in order to keep the emitter and collector junction transistor region capacitance small since $\tau_{ec}$ is also dependant on these parameters. A structure meeting these general requirements can be obtained with multiple emitter region transistor having an interdigitated emitter contact and base contact geometry with very narrow emitter contact and base contact fingers. A generalised figure of merit for such a transistor map be written as $$f_{max} \simeq \frac{20}{\frac{S}{2}+t}\ Gc/s$$

where $f_{max}$ is the frequency at which the grounded emitter power gain is equal to unity (the maximum frequency of oscillation), S is the width of an emitter region in microns, and $t$ is the separation between the parallel extending edges of an emitter region and an adjacent base contact finger in microns. Thus both the emitter width S and the base contact-emitter separation $t$ limit the high frequency performance and from the formula is seen that both should be as small as possible for transistors having high cut-off frequencies. However, the limiting dimension which is possible with the present technology will be $t$ since S is divided by two in the denominator in the said formula.

With the previously referred to shallow emitter and base diffusions there arises a problem in forming an emitter region, for example, an emitter finger of an interdigitated structure, of minimum width. This is because it is not always possible to provide the emitter contact in an opening in the insulating layer corresponding in size and position to an opening previously made in the insulating layer into which the emitter diffusion is made. The deposition of ohmic contact material into such an opening may lead to shorting of the emitter junction due to its very close positioning at the surface near to the edge of the opening in a device in which the emitter junction depth from the surface is very small, for example, 0.4 micron or less. The previously referred to physical limitations of the photoprocessing techniques thus impose a limitation on the width of an emitter region that is obtainable since it is necessary to use such techniques to form an opening in the insulating layer of smaller width, that is of the minimum reproduceable width obtainable, for the emitter contact. Thus the emitter width will of necessity have to be greater than the minimum reproduceable width obtainable with such techniques. Hitherto it has been found very difficult to reproduceably obtain openings in the insulating layer of less than 4 microns width and this results in the limitation of the emitter widths to at least 6 microns. The said limitations of the photoprocessing techniques also limit the separation width of the emitter and base contacts.

According to the invention a transistor comprises a semiconductor body or body part mainly of one conductivity type in which a collector region of the one conductivity type is situated, a diffused emitter region of the one conductivity type extending from one substantially plane surface of the body or body part and surrounded within the body or body part by a diffused base region of the opposite conductivity type, the emitter-base junction having a first part situated substantially parallel to the one surface and an adjoining second part extending to the one surface, a first high resistivity part of the base region underlying a central portion of the said first part of the emitter-base junction, an adjoining outer, second, lower resistivity part of the base region underlying an adjoining outer portion of the said first part of the emitter-base junction and further extending to the one surface, an adherent protective insulating layer on the one surface and ohmic contacts in openings in the insulating layer to the emitter region and to the second, lower resistivity part of the base region where these regions extend to the one surface.

In such a transistor the presence of the first, high resistivity base region part accentuates the current crowding effect since with increasing base current the injection becomes concentrated away from the central portion of the said part of the emitter-base junction and the current is crowded towards the outer portion of the said part of the emitter-base junction at lower current levels than would normally occur in a transistor having a base region part of a uniform resistivity distribution underlying the said part of the emitter-base junction. Thus the effective emitter area is determined by the length of the outer portion of the said part of the emitter-base junction having the underlying second, lower resistivity base region part. It is possible to form a transistor with such a length of small dimensions, for example, less than 2 microns and in a transistor according to the invention having an interdigitated electrode structure the dimension $t$ in the previously recited formula can be effectively reduced while still using the existing photoprocessing techniques. Furthermore the dimension S can be reduced in such a transistor according to the invention with a consequent increase in cut-off frequency being obtained.

In a preferred form of a transistor according to the invention the outer, second, lower resistivity base region part underlying the said first part of the emitter-base junction surrounds the first, high resistivity base region part underlying the said first part of the emitter base junction.

A transistor according to the invention may consist of a planar transistor in which the base-collector junction terminates at the one surface below the adherent protective insulating layer. Alternatively the transistor may be a mesa transistor in which the base-collector junction extends substantially parallel to the one surface and the area of this junction has been determined, for example, by an etching step subsequent to the base and emitter diffusions.

In one transistor of the said preferred form, within the semiconductor body or body part below the said first part of the emitter-base junction the boundary between the first, high resistivity base region part and the surrounding, outer, second, lower resistivity base region part is substantially rectangular and the overlying emitter region has a substantially rectangular surface area.

In another transistor of the said preferred form, within the semiconductor body or body part below the said first part of the emitter-base junction the boundary between the first, high resistivity base region part and the surrounding, outer, second, lower resistivity part is substantially circular and the overlying emitter region has a substantially circular surface area.

A transistor according to the invention may consist of a multiple emitter transistor, for example, a multiple emitter planar transistor, comprising a plurality of separate emitter regions in the semiconductor body or body part, each emitter-base junction having a first part situated substantially parallel to the one surface and an adjoining second part extending to the one surface, the base region comprising a corresponding plurality of first, high resistivity parts and a second, lower resistivity part, the first, high resistivity parts each underlying a central portion of the said first part of an emitter-base junction, and the second, lower resistivity part adjoining the first, high resistivity parts underlying the adjoining outer portion of the said first part of each emitter-base junction and further extending to the one surface.

Such a multiple emitter transistor may comprise a plurality of substantially parallel situated emitter regions each having a substantially rectangular area, ohmic contacts to the emitter regions and the second, low resistivity base region part where they extend to the one surface consisting of an interdigitated electrode system in which a plurality of interconnected ohmic contact fingers to the separate emitter regions are interdigitated with a plurality of interconnected ohmic contact fingers to the second, low resistivity base region part extending to the surface between the plurality of emitter regions where they extend to the one surface. Alternatively such a multiple emitter transistor may comprise a plurality of separate emitter regions each having a substantially circular area, a common ohmic contact to the emitter regions consisting of a metal layer situated in openings in the insulating layer exposing the emitter regions where they extend to the one surface and overlaying the insulating layer between adjacent emitter regions.

In a transistor according to the invention, the second lower resistivity base region part underlying the outer portion of the said first part of the emitter-base junction may extend completely to the underlying part of the base-collector junction.

The base region may comprise a peripheral deep diffused part of the opposite conductivity type with the part of collector-base junction between said peripheral part and the collector region which lies substantially parallel to the one surface being situated at a distance from the one surface which is greater than the distance from the one surface of the remainder of the collector-base junction between the base region parts within the said peripheral part and the collector region.

In a transistor according to the invention the semi-conductor body or body part may be of silicon. The insulating layer may be, for example, of silicon oxide or of silicon nitride.

In such a silicon transistor the second, lower resistivity base region part may underlie an outer portion of the said first part of the emitter-base junction which portion is at most 2 microns in length. The ohmic contact to the emitter region may be located in an opening in the insulating layer which is at most 4 microns in its minimum cross-dimension and which is of smaller area than an opening previously made therein to expose a surface portion into which the emitter diffusion is made. In such a transistor having an interdigitated electrode structure, at the one surface the separation of the adjacent extremities of an emitter region and a base contact finger may be at most 3 microns. The distance from the one surface of the part of the base-collector junction situated underlying the emitter-base junction or junctions may be less than $1\mu$.

In a preferred form of silicon transistor according to the invention of n-p-n structure, the first, high resistivity base region part has a diffused acceptor concentration at the location of the central portion of the said first part of the emitter-base junction of at most $10^{17}$ atoms/cc. and the second, low resistivity base region part has a diffused acceptor concentration at the location of the adjoining outer portion of the said first part of the emitter-base junction of at least $10^{18}$ atoms/cc.

Figure 4:
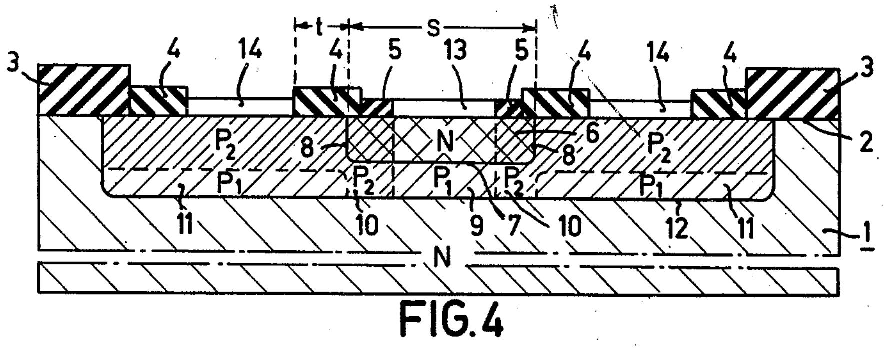
Figure 5:
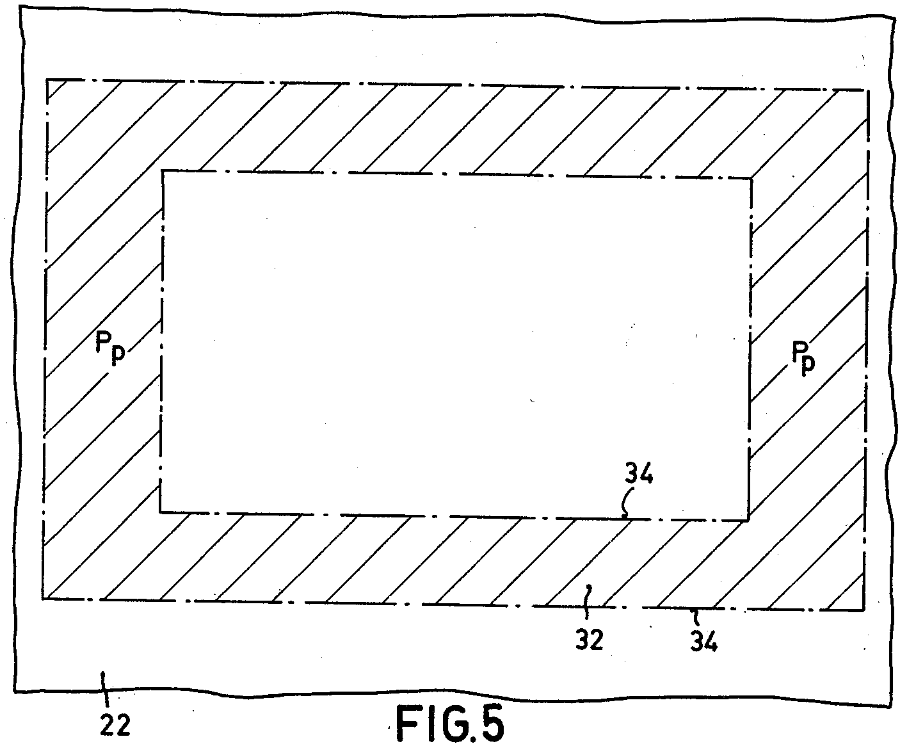
Figure 6:
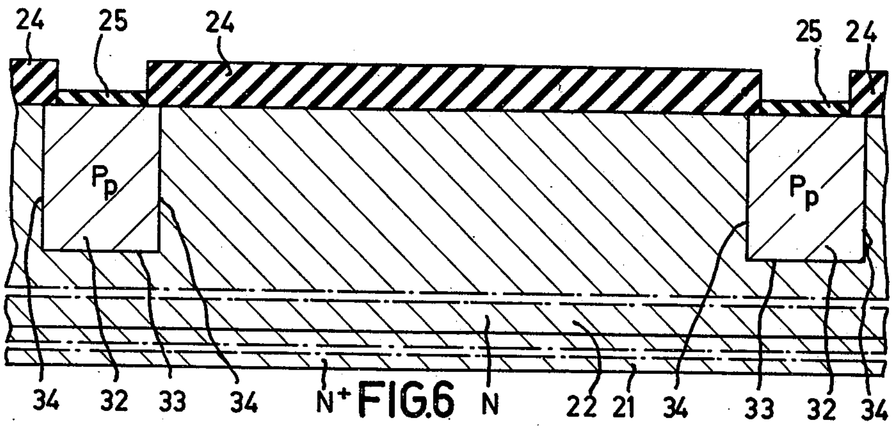
Figure 7:
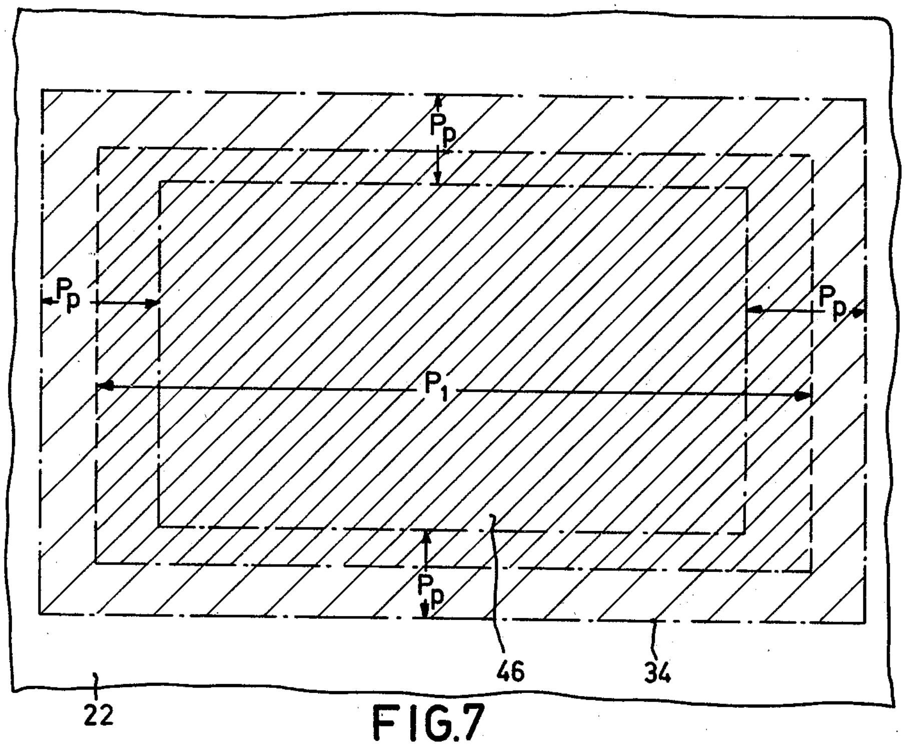
Figure 8:
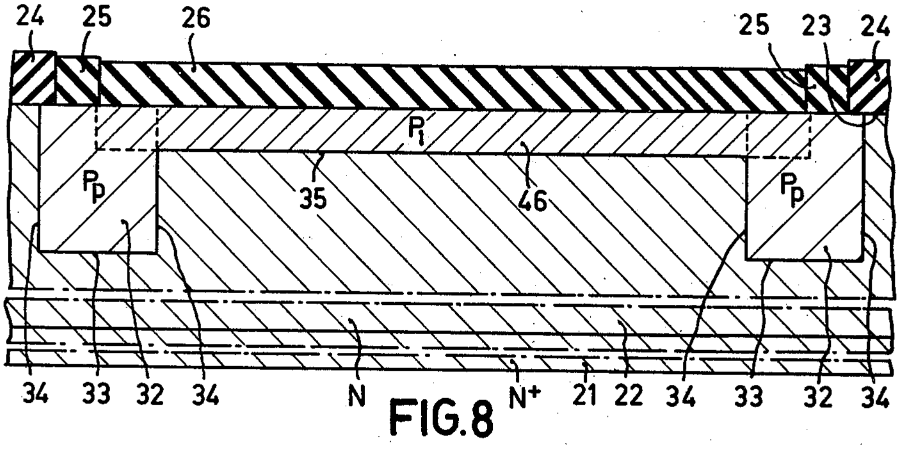
Figure 13:
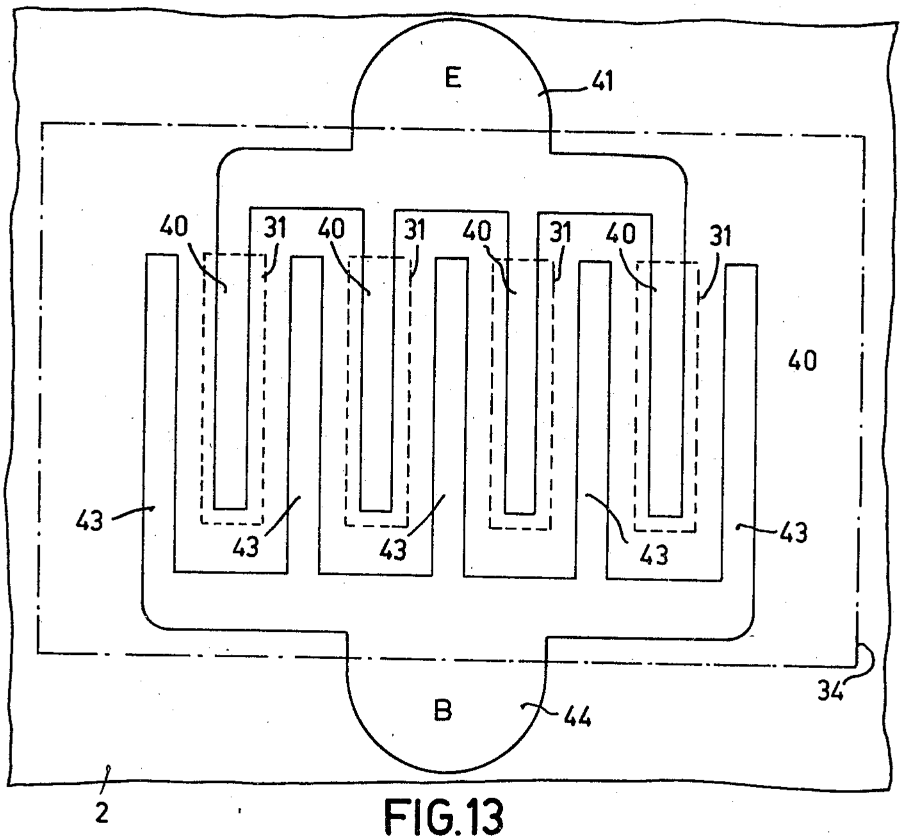
Figure 14:
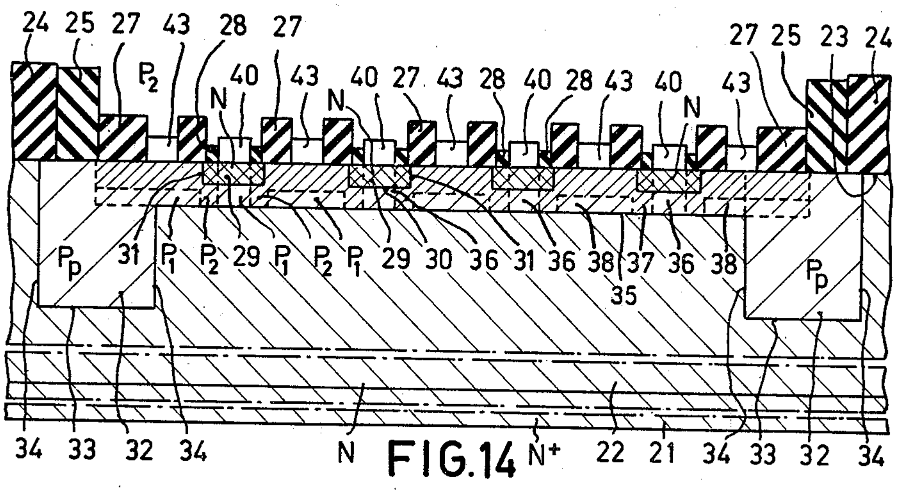
Figure 16:
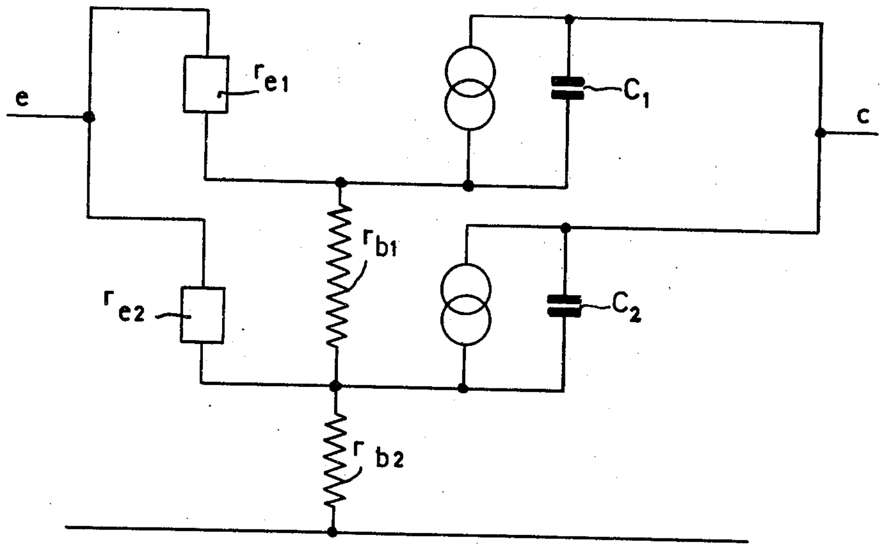
Figure 17:
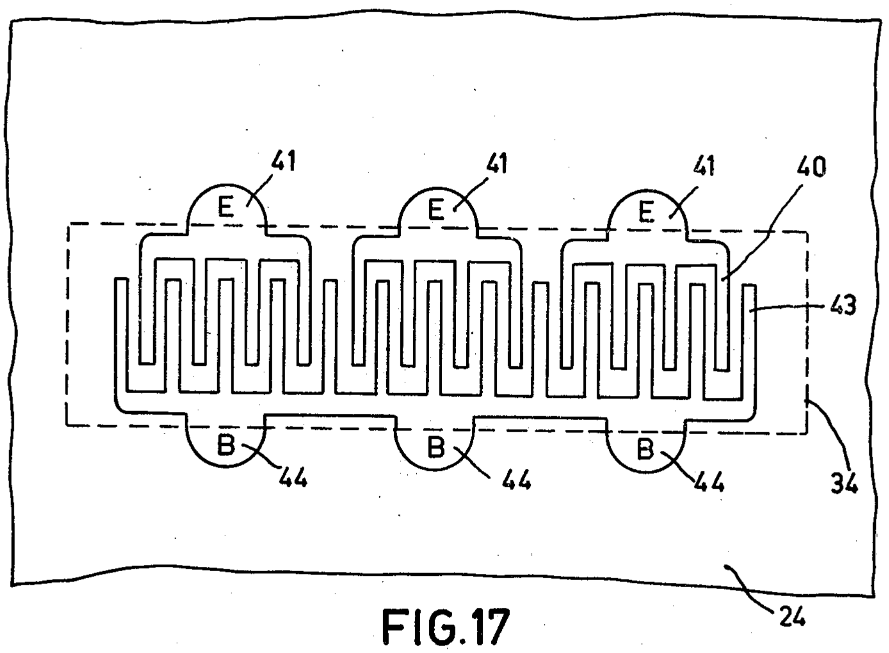

Embodiments of the invention will now be described by way of example, with reference to the accompanying diagrammatic drawings, in which:

FIGURES 1 to 4 show sections through part of a semiconductor body during successive stages of the manufacture of an n-p-n silicon planar transistor according to the invention and are completely diagrammatic serving only to illustrate the principles of the invention;

FIGURES 5 to 14 illustrate the manufacture of an n-p-n silicon planar transistor according to the invention having an interdigitated electrode structure, FIGURES 5 and 6, FIGURES 7 and 8, FIGURES 9 and 10, FIGURES 11 and 12, each showing a horizontal section taken just below the surface of part of the semiconductor body during successive stages in the manufacture of the transistor and FIGURES 13 and 14 show a plan view and vertical section respectively of part of the semiconductor body during a subsequent stage in the manufacture of the transistor; and FIGURES 16 and 17 show diagrammatic equivalent circuits of the transistor as shown in FIGURE 4 and serve to illustrate the operation of a transistor according to the invention.

Initially the transistor shown in FIGURE 4 will be described together with an outline of the method of manufacture with reference to FIGURES 1 to 4, thereafter the transistor shown in FIGURES 13 and 14 will be described together with a detailed description of its manufacture with reference to FIGURES 5 to 14.

The transistor shown in FIGURE 4 comprises an n-type silicon body 1 in which the collector region is located having a plane surface 2 on which an insulating layer (3, 4, 5,) is situated. An n-type emitter region 6 extends into the body from the surface 2 and is surrounded within the semiconductor body by a p-type base region. The emitter-base junction has a first part 7 extending substantially parallel to the surface 2 and an adjoining, second part 8 extending to the one surface below the insulating layer part 4. The base region consists of a first, high resistivity part 9 designated $P_1$ underlying a central portion of the part 7 of the emitter-base junction and an adjoining, outer surrounding second lower resistivity part 10 which is designated $P_2$, which underlies an outer portion of the part 7 of the emitter-base junction and further extends to the surface 2. The base region has a further high resistivity part 11 which is also designated $P_1$. The dotted line within the base region represents the location of the diffusion front of an acceptor element which has been diffused into the body to form the second low resistivity base region part 10 and this will be described in greater detail hereinafter with reference to the manufacture of the transistor.

The dotted line at the location below the part 7 of the emitter-base junction represents the boundary between the first, high resistivity base region part 9 and the second, lower resistivity base region part 10. A collector-base junction 12 extends to the surface 2 below the insulating layer part 3. In an opening in the insulating layer part 5 there is an emitter ohmic contact metal layer 13 and in an opening in the insulating layer part 4 there is a base ohmic contact metal layer 14.

Without further considering the surface geometry of the emitter and base regions and the configuration of the contact layers thereto the operation of the transistor will now be described in order to explain the underlying principles of the invention. At low forward base currents the injection across the emitter-base junction 7, 8 is fairly uniform but with increasing base current there occurs a transverse voltage drop across the base region part 9. The effect of this voltage drop is to reduce the potential difference applied to the central portion of the part 7 of the emitter-base junction. Thus with increasing base current the injection becomes concentrated away from the central portion and the current is crowded towards the outer portion of the part 7 of the junction. The presence of the first, high resistivity base region part 9 accentuates this effect since for a given current the transverse voltage drop is greater than would normally occur in a transistor having a base region part situated below the part 7 of the junction of uniform resistivity $P_2$. Thus contrary to normal practice, the resistivity of the base region in this planar transistor is deliberately arranged such that crowding of the current is enhanced, that is, crowding will occur at lower current levels than occurs in a transistor having a base region part of uniform resistivity distribution below the part 7 of the emitter-base junction. Thus a concentration of the current at quite low current levels occurs in the outer portion of the part 7 of the emitter-base junction which has the underlying second, lower resistivity base region part 10. Thus the effective area of the emitter-base junction is determined by this outer portion of the junction with the said underlying part 10. Some junction depths and emitter region dimensions will now be considered, these being typical of a high frequency, high power transistor of an interdigitated electrode structure. The collector-base junction depth is $0.6\mu$ and the emitter-base junction depth is $0.35\mu$ giving a base width between the parts of these junctions extending parallel to the surface of $0.25\mu$. A desirable emitter width would normally be, for example, about 4$\mu$ but with such junction depths this necessitates the formation of an emitter contact in the insulating layer in an opening smaller than that used for the emitter diffusion, that is, an opening of less than 4$\mu$ width, to prevent shorting of the emitter-base junction part 8 where it extends to the surface. However assuming that the smallest opening that can be made reproduceably in the insulating layer by the currently available photoprocessing and etching techniques is, for example, of 4$\mu$ width, this means that it is possible to have an emitter contact of 4$\mu$ width but the emitter region in the body will have to be wider than 4$\mu$. In the transistor shown in FIGURE 4 this problem is overcome in that the emitter region has a width of 9$\mu$ but due to the presence of the high and low resistivity parts 9 and 10 respectively the effective emitter width is less than 4$\mu$. This is because the length of the outer portion of the part 7 of the junction which has the underlying second, lower resistivity base region part 10 is less than 2$\mu$ on all sides of the central portion of the junction part 7. Thus in the section shown, by virtue of the accentuation of the current crowding effect, the effective emitter width is less than 4$\mu$ whereas the overall emitter width is 9$\mu$.

It will be appreciated that the emitter-junction part 7 has a central portion of at least 5 microns in length with the underlying first, high resistivity base region part 9 and this will effectively increase the junction capacitance.

Figure 15:
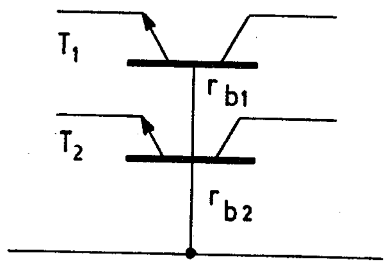

The structure may be considered to consist essentially of two transistors, as shown in FIGURE 15, one under the central portion of the emitter (transistor 1) and the other under the outer portions of the emitter (transistor 2). Part of the base resistance ($r_{b2}$) is common to both transistors. The equivalent circuit, in lumped form, can be represented as shown in FIGURE 16. Assuming T2 carries 90% of the current, then if the emitter resistance $r_{e2}$ is 0.4$\Omega$ at high frequencies the internal collector capacitance underneath the centre of the emitter $C_{1\ internal}$ (assumed equal to $C_{2\ internal}$, the collector capacitance underneath the outer portion of the emitter) will be charged through ($r_{e1}+r_{e2}+r_{b2}$) and not ($r_{b1}+r_{b2}$), ($r_{e1}+r_{e2}$) being in parallel with $r_{b1}$ at high frequencies. Hence the time constant due to $C_{1\ internal}$ will not be too large, because it is charged through ($r_{e1}+r_{e2}+r_{b2}$) and not ($r_{b1}+r_{b2}$) ($r_{e1}$ being of the same order as $r_{b2}$ through which $C_{2\ internal}$ is charged). The overall effect on transistor 2 will simply be the extra collector capacitance $C_{1\ internal}$ which will be small compared with the total collector capacitance ($C_{1\ internal}+C_{2\ internal}+C_{external}$). The gain of transistor 1 will fall off quicker than transistor 2 at high frequencies, but at such frequencies T1 is only handling 10% or less of the total power.

By forming the base region as in FIGURE 4 advantages arise in respect of the relative situation of the emitter and base contacts 13 and 14 respectively on the surface 2. As has been previously described the critical separation distance in an interdigitated electrode structure is *t*, the distance between adjacent edges of the base contact layer 14 and the emitter region 6. In such a transistor having an emitter and base region configuration as shown in FIGURE 4 this distance is less than 3$\mu$. This distance may be reduced to less than 2$\mu$ in another transistor according to the invention since assuming the minimum cross-dimension of an opening that can be obtained reproduceably is 4$\mu$ and the minimum separation of two such openings that can be formed reproduceably is also 4$\mu$, the separation *t* is determined by the cross-dimension of the insulating layer part 4 or the part of the surface to which the emitter-base junction part 8 extends. Since the emitter contact 13 is in an opening which is smaller than that of the opening used for the emitter diffusion *t* can be reduced by an amount corresponding to the cross-dimension of the insulating layers part 5 compared with a device in which the emitter contact is in the same opening as the opening used for the emitter diffusion.

It will be appreciated that the novel construction of the emitter and base regions can be applied to various kinds of transistors with varying electrode structures. For the sake of simplicity some of these will now be described for n-p-n structures. Thus, for example, the transistor structure shown in FIGURE 4 may be readily incorporated in an interdigitated electrode structure, for example in an interdigitated structure comprising a plurality of separate emitter regions 6 of substantially rectangular area, the boundary between the first, high resistivity base region part 9 and the surrounding, outer, second, lower resistivity part 10 being substantially rectangular, the base region parts 9, 10, 11 having been formed by the diffusion of an acceptor into a first surface portion to form a high resistivity base region part of resistivity profile $P_1$, and the subsequent diffusion into a second surface portion, which lies within the first portion and has a plurality of rectangular internal areas, of an acceptor to form the low resistivity base region part of resistivity profile $P_2$, the emitter region having been formed by the subsequent diffusion of a donor element into a plurality of third surface portions each of which lies within and is spaced from the outer periphery of the second surface portion and extends overlapping one of the said rectangular internal areas thereof, whereby the high resistivity base region parts are isolated to a plurality of parts 9 each underlying the central portion of a part 7 of an emitter-base junction. The contacts to the emitter and base regions can then be applied in an interdigitated form, part of the transistor having a section as shown in FIGURE 4.

Alternatively it is possible to construct a device embodying the basic structure of FIGURE 4 in which the emitter has a circular geometry. Thus, for example a transistor in which a large plurality of circular section emitters are interconnected by an overlaying metal layer can be formed. In this case the second acceptor diffusion is into a second surface portion having a plurality of internal circular areas and the subsequent emitter diffusion is into a plurality of third surface portions overlapping these areas. Furthermore the first and second acceptor diffusions may extend at their outer peripheries to a p+ diffused grid in the body between which the emitter sites are located and on which the base ohmic contact metallisation is provided. The advantages previously described with reference to an interdigitated electrode system similarly apply in this latter described structure which may be termed an "overlay" structure.

The manufacture of a transistor structor as is shown in FIGURE 4 will now be described in broad outline.

The starting material in an n-type silicon body 1 having a donor concentration of $2\times10^{15}$ atoms cm.$^{-3}$. Alternatively the starting material may consist of an n+-type silicon body having an thin p-type epitaxial layer 1 thereon of the said donor concentration. On a plane surface 2 of the body 1 insulating layer 3, for example of silicon oxide, is provided. An opening is made in the insulating layer 3 by a photoprocessing and etching step to expose a first surface portion. An acceptor, for example boron, is diffused into the first surface portion to form a first, high resistivity p-type base region part 11, which is designated $P_1$, and a collector-base p-n junction 12 having a part lying substantially parallel to the surface 2 at a depth therefrom of 0.6$\mu$ and a further part extending to the surface 2 below the silicon oxide layer 3 (FIGURE 1). The acceptor concentration at the surface is $2\times10^{18}$ atoms cm.$^{-3}$ and the acceptor concentration at a depth of 0.35$\mu$ is $6\times10^{16}$ atoms cm.$^{-3}$. During and/or subsequent to the acceptor diffusion a further insulating layer part 15 is formed on the first surface portion which adjoins and is contiguous with the insulating layer 3. Also the insulating layer 3 increases in thickness during and/or subsequent to the acceptor diffusion.

Subsequently a further opening is made in the insulating layer part 15 by a photoprocessing step and etching step to expose a second surface portion which lies within the first surface portion and has an internal rectangular or circular area. An acceptor, for example boron, is diffused into the second surface portion to form a second, lower resistivity base region part 10 (FIGURE 2) which is designated $P_2$ with the diffusion front shown in dotted outline extending from the surface at a distance of 0.4$\mu$ which is 0.2$\mu$ less than the distance therefrom of the previously formed collector-base p-n junction 11. The acceptor surface concentration is approximately $10^{20}$ atoms cm.$^{-3}$ and the acceptor concentration at a depth of 0.35$\mu$ is $2\times10^{16}$ atoms cm.$^{-3}$. During and/or subsequent to the second acceptor diffusion a further insulating layer part 4 (FIGURE 2) is formed on the second surface portion which adjoins and is contiguous with the insulating layer parts 3 and 15. Also the thickness of the insulating layer parts 3 and 15 is increased.

Figure 3:
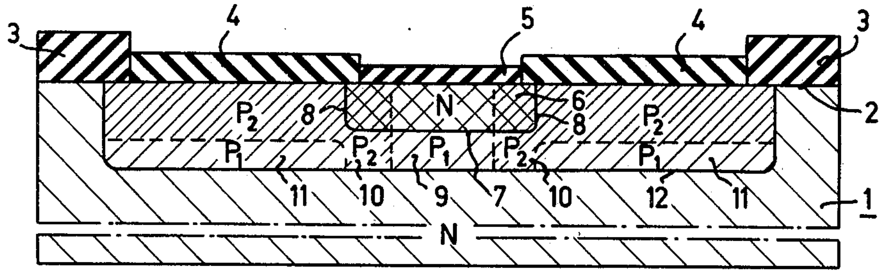

A further opening is made in the insulating layer (4, 15) by a photoprocessing and etching step to expose a third surface portion of rectangular or circular area which lies wholly within the second surface portion and extends uniformly overlapping the internal rectangular or circular area of the second surface portion. A donor element, for example phosphorus, is diffused into the third surface portion to form an emitter region 6 and an emitter-base junction having a first part 7 extending substantially parallel to the surface 2 and an adjoining part 8 extending to the surface 2 below the insulating layer part 4. During the donor diffusion, the diffusion of the acceptor element in the underlying portion of the second, low resistivity base region part 10 is enhanced and the diffusion front is pushed forward to extend the underlying portion to the collector-base junction 12. This results in the isolation of a first, high resistivity base region part 9 underlying the central portion of the part 7 of the emitter-base junction and a surrounding outer, second, lower resistivity base region part 10 underlying an outer portion of the part 7 of the emitter-base junction and which further extends to the surface 2 (FIGURE 3). It is found that the enhancement of an acceptor diffusion by a subsequently carried out donor diffusion is only really significant in those parts of the semiconductor body where the diffused acceptor concentration exceeds a certain value. Thus at the initial location of the collector base junction defined by the first acceptor diffusion the diffused acceptor concentration is $2\times10^{15}$ atoms cm.$^{-3}$ and the donor diffusion substantially does not have the effect of pushing forward this junction further into the body.

During and/or subsequent to the donor diffusion a further insulating layer part 5 is formed on the third surface portion which adjoins and is contiguous with the insulating layer part 4. Further openings are made in the insulating layer (3, 4, 5) by a photoprocessing and etching step to expose the emitter region 6 and the second, low resistivity base region part 10 where these regions extend to the surface 2. Ohmic contact material, for example aluminum, is deposited in the openings and on the surface of the remaining insulating layer parts. The ohmic contact material is selectively removed by a further photoprocessing and etching step to leave ohmic contacts 13 and 14 in the openings to the emitter region 6 and the base region part 10 respectively. Thereafter the manufacture of the transistor is as normally occurs in the manufacture of silicon planar transistors.

The transistor shown in FIGURES 13 and 14 is an n-p-n silicon epitaxial planar transistor having an interdigitated electrode structure. The transistor comprises an an $n^+$-type silicon body 21 of 700$\mu$ x 700$\mu$ x 125$\mu$ thickness of .01 ohm-cm. resistivity having an n-type epitaxial layer 22 thereon of 7$\mu$ thickness and of 2.0 ohm-cm. resistivity which has a donor concentration of $2\times10^{15}$ atoms.cm.$^{-3}$. The epitaxial layer 22 has a plane surface 23 on which there is an adherent protective insulating layer of silicon oxide having parts 24, 25, 27 and 28. Extending from the surface 23 into the epitaxial layer there are four separate n-type emitter regions 29 each of rectangular section and of a surface area of approximately 9$\mu$ x 36$\mu$ having a separation between adjacent edges of approximately 11$\mu$. The emitter regions 29 are surrounded within the body by a p-type base region and each emitter-base junction has a first part 30 extending parallel to the surface 23 at a distance therefrom of 0.35$\mu$ and an adjoining, second part 31 extending to the surface 23 below an insulating layer part 27. The base region comprises a peripheral part 32 of p-type conductivity, which is designated $P_p$. The p-n junction between the peripheral base region part 32 and the n-type collector region in the epitaxial layer 22 has a part 33 extending parallel to the surface 23 at a distance therefrom of about 2$u$ and an adjoining part 34 extending to the surface 23 below the insulating layer part 24. The peripheral base region part 32 is of rectangular outline, the junction part 34 being shown in dash-dotted outline in FIGURE 13, having outer dimensions of approximately 114$\mu$ x 72$\mu$ and internal dimensions of approximately 82$\mu$ x 48$\mu$, the width of the peripheral base region part 32 in the section of FIGURE 14 being approximately 16$\mu$. The acceptor surface concentration of the part 32 is approximately $2\times10^{19}$ atoms.cm.$^{-3}$. The remainder of the base region is situated within the part 32 with a part 35 of the base-collector junction extending parallel to the surface 23 at a distance therefrom of 0.6$\mu$. The base region further comprises four first, high resistivity parts 36, each of which is designated $P_1$ and underlies a central portion of the part 30 of an emitter-base junction, and a second, lower resistivity part 37 which surrounds the first high resistivity parts 36, underlies the outer portions of the parts 30 of the emitter-base junctions and further extends to the surface 23. The second, lower resistivity base region part 37 is designated $P_2$. The base region also comprises five further high resistivity parts 38, each of rectangular area and also designated $P_1$. The acceptor surface concentration of the base region part 37 is approximately $10^{20}$ atoms.cm.$^{-3}$ and the acceptor concentration in the base region part 37 at a depth from the surface of 0.35$\mu$ at the sides of the emitter regions, that is at the same depth as the emitter-base junction part 30, $2\times10^{16}$ atoms.cm.$^{-3}$ whereas the acceptor concentration at the outer portion of the emitter-base junction part 30 is at least $10^{18}$ atoms.cm.$^{-3}$. The acceptor concentration in the first, high resistivity base region part 36 at a depth of 0.35$\mu$ from the surface, that is at the location of the central portion of emitter-base junction part 30 is $6\times10^{16}$ atoms.cm.$^{-3}$. The donor surface concentration of the emitter regions is $1\times10^{21}$ atoms.cm.$^{-3}$. Each first, high resistivity base region part 36 underlying the central portion of the part 30 of the emitter-base junction is of rectangular area and has dimensions of approximately 5$\mu$ x 32$\mu$. The second, lower resistivity base region part 37 underlies an outer portion of the part 30 of each emitter-base junction which has a length of just under 2$\mu$ on all sides of the central portion. On the surface 23 and on the surface of the insulating layer parts (24, 25, 27 and 28) there is an interdigitated electrode system consisting of an emitter contact pattern interdigitated with a base contact pattern. The emitter contact pattern has four fingers each consisting of aluminum layer 40 of 0.3$\mu$ thickness situated in a rectangular opening of 5$\mu$ x 32$\mu$ in the insulating layer part 28 which exposes an emitter region where it extends to the surface, the layer 40 further extending over the insulating layer parts (28, 27, 25, and 24) to a large area emitter contact bonding pad 41. The base contact pattern has five fingers each consisting of an aluminum layer 43 of 0.3$\mu$ thickness situated in a rectangular opening of 5$\mu$ x 36$\mu$ in the insulating base region part 37 where it extends to the surface, the layer 43 further extending over the insulating layer parts (27, 25, 24) to a large area base contact bonding pad 44. The three inner base contact fingers are symmetrically disposed between the emitter contact fingers and the separation of the edges of the parallel extending parts of the layers 40 and 43 being approximately 5$\mu$. Similarly the two outer base contact fingers are situated with the separation of the edges of the parallel parts of the layers 40 and 43 being approximately 5$\mu$. The semiconductor body has a large area ohmic contact (not shown) to the collector region on the surface of the $n^+$ substrate 21 remote from the surface 23 of the epitaxial layer, the substrate 21 being mounted on a header part of an envelope. Connecting leads extend between posts on the header and the emitter and base contact bonding pads 41 and 43 respectively, the leads being thermocompression bonded thereto.

The manufacture of the transistor shown in FIGURES 13 and 14 will now be described with reference to FIGURES 5 to 14.

The manufacture starts from a slice of 2.5 cm. diameter of low resistivity $n^+$-type silicon (.01 ohm.cm.), having a higher resistivity (2.0 ohm-cm.) n-type epitaxial layer of 7$\mu$ thickness thereon in which phosphorus is the donor element in a substantially uniforms concentration of $2.0 \times 10^{15}$ atoms.cm.$^{-3}$. The surface of the epitaxial layer is prepared so that it has a damage free crystal structure and an optically flat finish. The starting material being a slice of 2.5 cm. diameter having the epitaxial layer thereon will yield a plurality of transistors by carrying out subsequent steps in the manufacture using suitable optical masks such that a plurality of individual transistor elements are formed on the single slice which are later separated by dicing of the slice but the method will now be described with reference to the formation of an individual transistor element on the slice, it being assumed that where masking, etching, diffusion and associated steps are referred to these steps are each simultaneously carried out for each individual transistor element on the slice prior to the eventual dicing thereof.

An insulating layer 24 of 0.5$\mu$ thickness of silicon oxide is grown on the prepared surface of the epitaxial layer by heating of the silicon body (21, 22) at 1150° C. for 50 minutes in an atmosphere of wet oxygen and thereafter at the same temperature for 15 minutes in an atmosphere of dry oxygen.

A photosensitive resist layer consisting of material available commercial as KTFR (Kodak Thin Film Resist) is applied to the surface of the silicon oxide layer 24. With the aid of optical mask the photoresist layer is exposed such that an area of external dimensions 110$\mu$ x 68$\mu$ and internal dimensions 86$\mu$ x 52$\mu$ is shielded from the incident radiation. The unexposed part of the resist layer is removed with a developer so that an opening of the said dimensions is formed in the resist layer. The underlying part of the silicon oxide layer 24 exposed by the opening in the resist layer is etched with a fluid consisting of hydrogen fluoride and ammonium fluoride in the silicon oxide layer 24, to expose a surface portion of the silicon epitaxial layer. The remaining parts of the photoresist layer are then removed by boiling in a mixture of hydrogen peroxide and sulphuric acid.

The silicon body is placed in an open tube type of diffusion furnace which has a portion of enlarged diameter at the inlet end within the furnace and contains a glass layer of boron trioxide. The glass layer acts as a source of boron for diffusion onto the exposed surface portion. The boron diffusion is a two-stage process and consists of a deposition stage followed by a so-called drive-in stage. The deposition is effected by heating the tube and contents at 900° C. for two hours with a flow of dry nitrogen over the boron trioxide glass and then over the silicon body. This causes deposition of a boron trioxide glass on the exposed surface portion of the silicon within the opening in the insulating layer 24. The following drive-in stage is effected by heating the tube and contents at 1180° C. for 20 minutes with a flow of dry oxygen over the body. This two-stage boron diffusion process results in the formation of a peripheral base region part 32 (FIGURES 5 and 6) in which the p-n junction between the part 32 and the n-type epitaxial layer 22 has a part 33 extending parallel to the surface 23 at a depth therefrom of about 2$\mu$ and an adjoining part 34, shown by the chain dot line in FIGURE 6, extending to the surface 23 below the silicon oxide layer 24. The boron surface concentration is approximately $2 \times 10^{19}$ atoms.cm.$^{-3}$. During this process an insulating layer part 25 of about 0.5$\mu$ thickness and consisting of a borosilicate glass is formed on the exposed surface portion of the silicon i n the opening in the silicon oxide layer 24. The thickness of the insulating layer part 24 is also increased to a slight extent by the addition of a thin layer of a borosilicate glass.

The silicon body is removed from the diffusion furnace and a fresh photosensitive resist layer of KTFR is applied to the surface. The layer is exposed with the aid of an optical mask such that a rectangular area of 100$\mu$ x 60$\mu$ which is symmetrically disposed within the outer periphery of the area occupied by the previously formed opening, is shielded from the incident radiation. The unexposed part of the layer is removed with a developer so that a rectangular opening of 100$\mu$ x 60$\mu$ is former in the photoresist layer. Etching is carried out with the previously referred to etchant to form a corresponding opening in the insulating layer parts (24, 25) and to expose a surface portion of the silicon of corresponding area.

The body is placed in an open tube of diffusion furnace having a boron source of a boron trioxide glass as previously described. A deposition stage is carried out with a flow of dry nitrogen for 10 minutes at 900° C. Further oxidation of the surface and a drive-in stage is simultaneously carried out by passing wet oxygen over the body in the furnace tube for 150 minutes at 1,000° C. and then passing dry oxygen over the body in the furnace tube for 10 minutes at this temperature. This boron diffusion results in the formation of a high resistivity p-type base region part 46 (FIGURES 7 and 8) designated $P_1$ which is surrounded within the body by the previously formed peripheral base region part 32. The p-n junction part 35 between the high resistivity p-type base region part 46 and the n-type epitaxial layer 22 extends parallel to the surface 23 at a depth therefrom of 0.6$\mu$. This p-n junction part adjoins the p-n junction parts 34 and 33 and together these constitute the base-collector junction of the transistor. The deeper peripheral base region part is provided to yield a high base-collector junction breakdown voltage $BV_{BCO}$. During the diffusion an insulating layer part 26 of about 0.65$\mu$ thickness is formed on the exposed surface portion and consists largely of silicon oxide. Also the thickness of the insulating layer parts 25 and 24 increases to a slight extent due to a layer of silicon oxide being formed on these parts.

Figure 9:
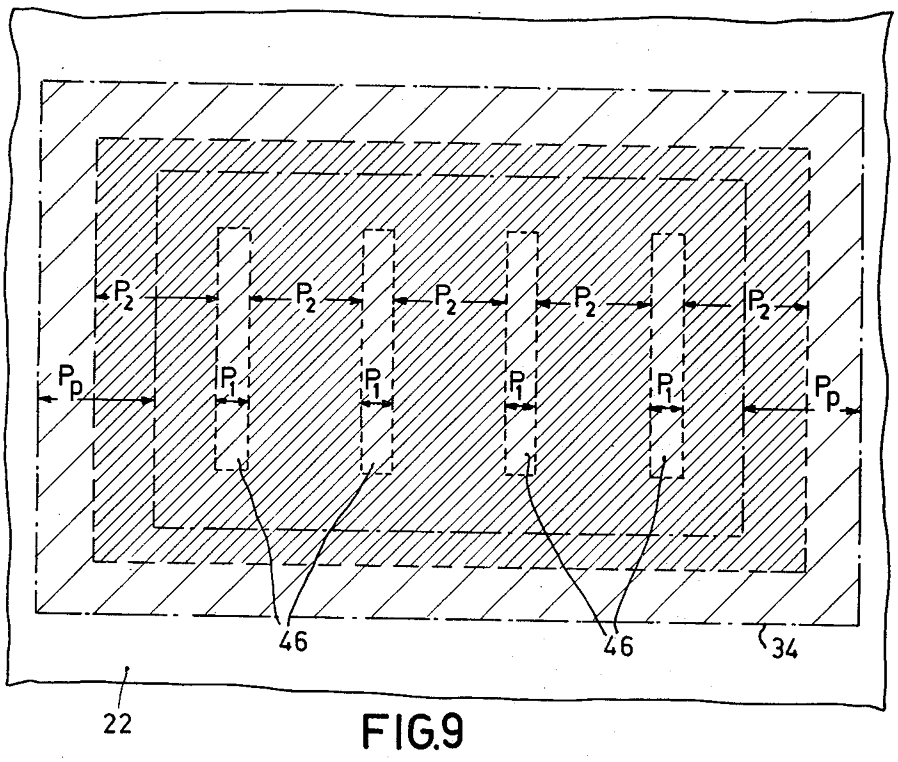
Figure 10:
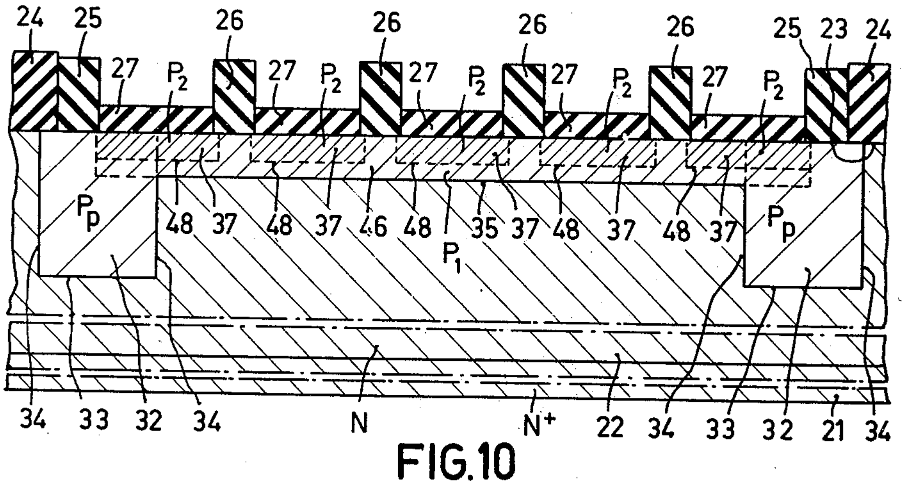
Figure 11:
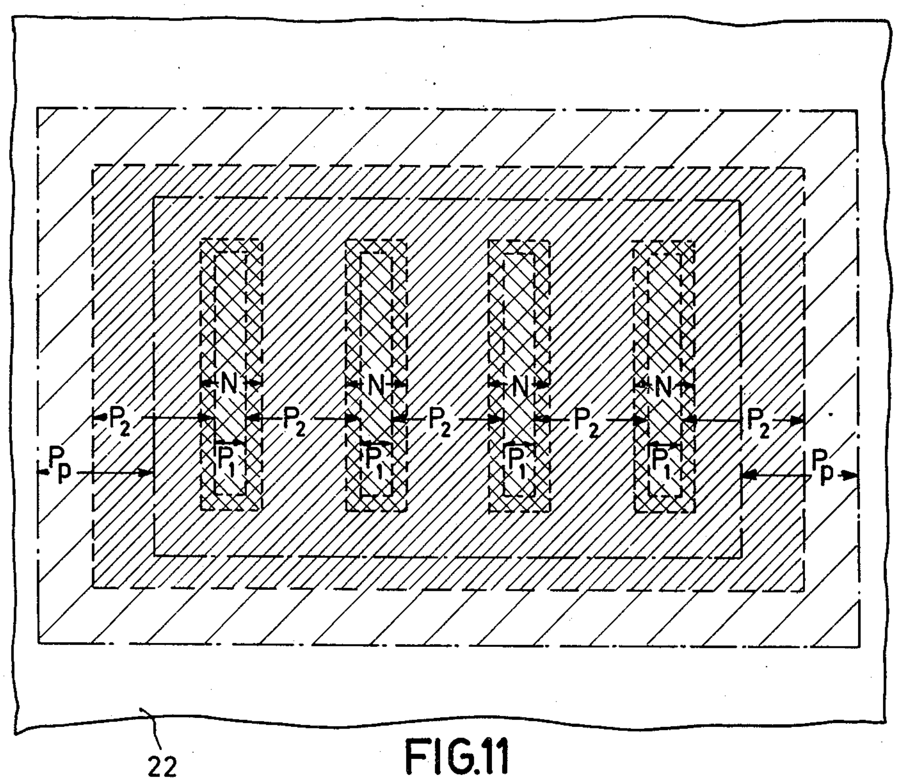
Figure 12:
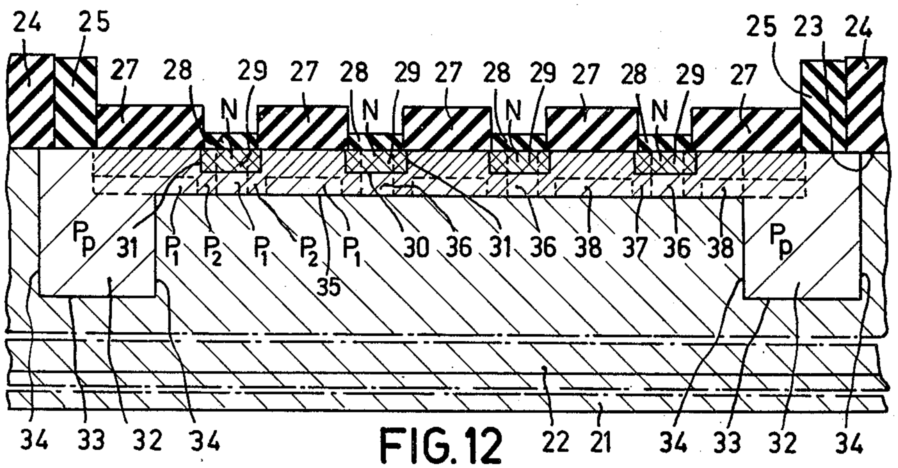

The silicon body is removed from the diffusion furnace and a fresh photosensitive resist layer of material available commercially as Shipley-resist is applied to the surface. The layer is exposed with the aid of an optical mask such that a rectangular area 100$\mu$ x 60$\mu$ having four internal rectangular areas of 5$\mu$ x 32$\mu$ is exposed to the incident radiation. The outer periphery of the 100$\mu$ x 60$\mu$ areas corresponds with the periphery of the previously formed rectangular opening. The exposed part of the layer is removed with a developer so that a rectangular opening of 100$\mu$ x 60$\mu$ with four internal rectangular areas of 5$\mu$ x 32$\mu$ remaining is formed in the photoresist layer. Etching is carried out with the previously referred to etchant to form a corresponding opening in the insulating layer part 26 to expose a surface portion of corresponding area. The silicon body is placed in an open tube type of diffusion furnace having a boron source consisting of the previously described boron trioxide glass. A diffusion process is carried out with a deposition stage with a flow of dry nitrogen for 40 minutes at 900° C. followed by a first drive-in stage with a flow of dry oxygen for 15 minutes at 1050° C. The body is thereafter removed from the diffusion furnace and placed in a further diffusion tube which has a vacuum line connection at one end and two liquid reservoirs connected with tap connections at the other end. One reservoir contains tetra-ethoxy-silane (TEOS) and the other contains trimethyl orthophosphate (TMP), both reservoirs being at room temperature. The body is maintained in the furnace tube at 750° C. and the vacuum line connection is applied with the tap to the liquid reservoir of TEOS open for a period of 80 minutes, and during an intermediate period of 40 minutes during the total 80 minutes period the tap to the liquid reservoir of TMP is opened. The vapours of the two volatile liquids are thermally decomposed in the tube and a phosphosilicate glass layer is formed on the surface of the body above the silicon oxide glass layer formed during the previous deposition and first drive-in stage. The body is thereafter put back into an open tube type of furnace and a second drive-in stage is carried out with a dry oxygen flow for 15 minutes at 1050° C. This results in the formation of a low resistivity p-type base region part 37 (FIGURES 9 and 10) which is located within the previously formed high resistivity p-type base region part 46. The diffusion front of the latter boron diffusion step extends into the body at a depth of 0:4$\mu$ from the surface and is indicated in the dotted lines 48 in FIGURE 10. The boron concentration at the surface of the part 37 is approximately $10^{20}$ atoms.cm.$^{-3}$. FIGURES 9 and 10 show the semiconductor body after this boron diffusion and silane process. The low resistivity base region part 37 which forms a web in the body within the peripheral base region part 32 is designated $P_2$. During this boron diffusion and silane step an insulating layer part 27 consisting of a phosphosilicate glass is formed on the exposed surface portion and has a thickness of about 0.35$\mu$. The thickness of the remaining insulating layer parts (24, 25, 26) is also increased by about 0.35$\mu$ by a glass layer of the said composition.

The silicon body is removed from the diffusion furnace and a fresh photosensitive resist layer of Shipley resist is applied to the surface. The layer is exposed with the aid of an optical mask such that four parallel extending rectangular areas of 9$\mu$ x 36$\mu$, having a spacing between adjacent sides of 11$\mu$ and each lying symmetrically disposed above a part of the surface to which the high resistivity base region part 46 extends, are exposed to the incident radiation. The exposed parts of the photoresist layer are removed with a developer so that four rectangular openings of 9$\mu$ x 36$\mu$ are formed in the photoresist layer. Etching is carried out with the previously referred to etchant to form four corresponding openings in the insulating layer parts (26, 27) and expose four surface portions of corresponding area.

The silicon body is placed in one zone of a two zone type of diffusion furnace tube, the other zone containing phosphorous pentoxide which is maintained at 210° C. The body is heated for 15 minutes at 970° C. with a flow of dry nitrogen over the phosphorous pentoxide and then over the body. During this diffusion process phosphorous diffuses into the four exposed surface portions to form four n-type emitter regions (FIGURES 11 and 12), each emitter-base junction having a part 30 extending parallel to the surface 23 at a distance therefrom of 0.35$\mu$ and an adjoining part 31 extending to the surface below the insulating layer part 26. During the phosphorous diffusion the diffusion of the boron in the lower resistivity base region part 37 ($P_2$) is enhanced at positions below the exposed surface portion so that parts of the boron diffusion front 48 are pushed forward and the lower resistivity base region part is selectively pushed forward further into the body. The diffusion conditions are such that the enhancement of the boron diffusion extends this region at the parts underlying the emitter-base junction completely to the previously formed collector-base junction part 35. The results in the formation of a first, high resistivity base region part 36 (designated $P_1$) underlying a central portion of the part 30 of an emitter-base junction and a surrounding outer, second lower resistivity base region part 37 (designated $P_2$) underlying an outer portion of the part 30 of the emitter-base junction and further extending to the surface 23 below the insulating layer part 26. Five further high resistivity base region parts 38 (also designated $P_1$) of the rectangular area also remain.

The diffused phosphorus surface concentration is $1\times10^{21}$ atoms.cm.$^{-3}$. During the phosphorus diffusion a very thin layer of a phosphosilicate glass is formed on the four exposed surface portions. The silicon body is removed from the furnace and the phosphosilicate glass removed by dissolving in a solution of dilute hydrofluoric acid. The body is then placed in a further furnace to effect a silane process using tetra-ethoxy-silane (TEOS), the body being heated at 750° C. for 40 minutes in the TEOS atmosphere. This results in the deposition of a glass layer 28 of silicon oxide of 0.2$\mu$ thickness in the re-exposed surface portions and the deposition of 0.2$\mu$ of silicon oxide on the remaining insulating layer parts (24, 25, 27).

A fresh photosensitive resist layer of KTFR is applied to the surface and with the aid of an optical mask is exposed so that four parallel extending rectangular areas of 5$\mu$ x 32$\mu$ each symmetrically disposed above the surface area occupied by an emitter region 29 and five parallel extending rectangular areas of 5$\mu$ x 36$\mu$ alternating with the other four areas and extending above the surface area occupied by the second, lower resistivity base region part 37 are shielded from the incident radiation. The unexposed parts of the resist layer are removed with a developer and four openings of 5$\mu$ x 32$\mu$ and five openings of 5$\mu$ x 36$\mu$ are formed in the resist layer. Corresponding openings are made in the insulating layer parts 28 and 26 respectively by etching with the previously referred to etchant. There after the remaining parts of the photoresist layer are removed.

Aluminum is evaporated over the upper surface of the body to form a layer of 0.3$\mu$ thickness extending in the four 5$\mu$ x 32$\mu$ openings, in the five 5$\mu$ x 36$\mu$ openings and over the insulating layer parts (28, 27, 25, 24). The surface of the aluminum layer is covered with a layer of a photosensitive lacquer commercially available as "Kopierlac." The lacquer layer is exposed with the aid of an optical mask such that an interdigitated pattern with one set of fingers of 5$\mu$ width extending above the areas of the previously formed 5$\mu$ x 32$\mu$ openings and another set of fingers of 5$\mu$ width extending above the areas of the previously formed 5$\mu$ x 36$\mu$ openings are shielded from the incident radiation. The exposed parts of the lacquer layer are then developed using a weak potassium hydroxide solution. The parts of the aluminum layer not protected by the lacquer layer are then dissolved in orthophosphoric acid to yield an interdigitated electrode pattern as shown in FIGURES 13 and 14 having an emitter ohmic contact consisting of an aluminum layer 40 with four fingers terminating in an emitter contact bonding pad 41 on the insulating layer part 24 and a base ohmic contact consisting of an aluminum layer 43 with four fingers terminating in a base contact bonding pad 44 on the insulating layer part 24. The remaining lacquer is dissolved in acetone.

Thereafter the silicon slice is divided into a plurality of separate transistor elements. The $n^+$-type substrate is mounted on a header part of an envelope. Wires are then thermocompression bonded to the pads 41 and 44 and the other extremities of the wire are connected to posts on the periphery of the header. The transistor is then encapsulated by sealing a cap portion over the header.

FIGURE 17 is a plan view of the surface of part of the semiconductor body of a multiple-emitter n-p-n silicon planar transistor according to the invention which is a modification of the embodiment of FIGURES 13 and 14 and corresponding parts are identified with the same reference numerals. In this transistor the area of the inner base region part is approximately three times that of the inner base region part in the previously described transistor and lies within a deep-diffused peripheral p-type part, the collector-base junction part 34 shown in dashed outline terminating in the surface below the insulating layer part 24. The interdigitated emitter and base contacts consist of three units each corresponding in size to that of the contact pattern of the previously described transistor. In each unit there is a large area emitter contacting portion 41 and a large area base contacting portion 44, the base contact fingers all being connected in common to the three portions 44 in this embodiment. The manufacture of this transistor is similar to the manufacture of the previously described transistor, suitably enlarged masks being used for the photoprocessing steps.

What is claimed is:

1. A transistor comprising a semiconductive body having a planar surface portion and on the surface portion an adherent insulating layer, a collector region of one type conductivity in the body, a diffused base region of the opposite type conductivity within the collector region and forming a collector junction, at least one diffused surface emitter region of the one type conductivity nested within the base region and forming a cup-shaped emitter junction having a first part situated substantially parallel to the planar surface portion and an adjoining second part extending from the first part to the planar surface portion underneath the insulating layer, the portion of said collector junction extending beneath the emitter region being substantially planar and parallel to the planar surface portion, said base region comprising a first higher resistivity part underlying a central portion of the first emitter junction part and extending to the collector junction, said base region further comprising a second adjoining outer lower resistivity part contiguous with and surrounding the first base region part and underlying an adjoining outer portion of said first emitter junction part and extending to the planar surface portion, said insulating layer having a first opening over the emitter region, an emitter contact extending through the first opening into contact with the emitter region, said insulating layer having a second opening over the second base region part extending to the planar surface portion, and a base contact extending through the second opening into contact with the second base region part.

2. A transistor as set forth in claim 1 and comprising means for applying only a single potential to the base region via the base contact.

3. A transistor as set forth in claim 2 wherein the collector region also extends to the said planar surface portion under the insulating layer, and the diffused base region forms a cup-shaped collector junction extending to the planar surface portion underneath the insulating layer.

4. A transistor as set forth in claim 3 wherein the boundary between the first and second base region parts is substantially rectangular, and the overlying emitter region has a substantially rectangular surface area.

5. A transistor as set forth in claim 3 wherein the boundary between the first and second base region parts is substantially circular, and the overlying emitter region has a substantially circular surface area.

6. A transistor as set forth in claim 3 wherein the second base region part underlying the first emitter junction part extends to the collector junction.

7. A transistor as set forth in claim 3 wherein the length of the said outer portion of said first emitter junction part under which extends the second base region part is at most two microns.

8. A transistor as set forth in claim 3 wherein the minimum lateral dimension of the first opening for receiving the emitter contact is at most four microns.

9. A transistor as set forth in claim 8 wherein the largest spacing between the second emitter junction part and the base contact is at most three microns.

10. A transistor as set forth in claim 3 wherein the base region comprises a third peripheral part which is deeper in the body and further from the planar surface portion than either of the first and second base region parts.

11. A transistor as set forth in claim 10 wherein the body is of silicon, the first base region part having at the location of the first emitter junction part an acceptor concentration of at most $10^{17}$ atoms/cc. and the second base region part having at the location of the second emitter junction part an acceptor concentration of at least $10^{18}$ atoms/cc.

12. A transistor as set forth in claim 3 wherein plural, separate emitter regions are provided each forming first and second emitter junction parts, and the base region comprises plural first and second parts each associated with one of the emitter regions.

13. A transistor as set forth in claim 12 wherein the emitter and base contacts form an interdigitated electrode system contacting, respectively, all the emitter regions and all the second base region parts.

14. A transistor as set forth in claim 12 wherein the emitter contact comprises a metal layer extending through openings in the insulating layer into contact with all the emitter regions and overlaying the insulating layer between adjacent emitter regions.

15. A transistor as set forth in claim 3 wherein the largest dimension of the first emitter junction part is at most 2 microns, and the distance of the collector junction portion underlying the emitter junction from the planar and all the second base region parts.

16. A transistor comprising a semiconductive body having a planar surface and on the surface an adherent insulating layer, a collector region of one type conductivity in the body and extending to the planar surface, a diffused base region of the opposite type conductivity nested within the collector region and forming a collector junction extending to the planar surface underneath the insulating layer, a plurality of spaced surface emitter regions of the one type conductivity nested within the base region and forming plural cup-shaped emitter junctions each having a first part situated substantially parallel to the planar surface and an adjoining second part extending from the first part to the planar surface underneath the insulating layer, the portion of said collector junction extending beneath the emitter regions being substantially planar and parallel to the planar surface, said base region comprising a first inner diffused region extending under all the emitter regions forming a p-n collector junction extending parallel to the planar surface at a distance therefrom of at most one micron and a second outer peripheral region continguous with the first region and laterally spaced outwardly from the emitter regions forming a deeper p-n collector junction extending parallel to the planar surface at a distance therefrom of at least two microns, said insulating layer having first openings over each of the emitter regions, an emitter contact comprising a metal layer on the insulating layer and having a plurality of fingers each extending through one of the first openings into contact with one of the emitter regions, said insulating layer having second openings over at least first base regions extending to the surface between the spaced emitter regions and overlying the collector junction spaced at most one micron from the surface, and a base contact comprising a metal layer on the insulating layer and having a plurality of fingers each extending through one of the second openings into contact with the first base regions, said base contact fingers being interdigitated with the emitter contact fingers, the first inner base region comprising plural first parts of higher resistivity each underlying a central portion of a first emitter junction part and extending to the collector junction, and plural second parts of lower restivity contiguous with and surrounding the first parts and each second part underlying an adjoining outer portion of said first emitter junction part and extending to the surface where contacted by one of the base contact fingers.

17. A transistor as set forth in claim 16 wherein the spacing between the interdigitated base and emitter contact fingers is at most three microns.

References Cited

UNITED STATES PATENTS

| | | | |
|---|---|---|---|
| 3,381,183 | 4/1968 | Turner | 317—234 |
| 3,358,197 | 12/1967 | Scarlett | 317—235 |
| 3,377,526 | 4/1968 | Beale | 317—235 |
| 3,389,023 | 6/1968 | Langdon | 148—187 |

FOREIGN PATENTS

| | | |
|---|---|---|
| 1,018,673 | 1/1966 | Great Britain. |

JOHN W. HUCKERT, Primary Examiner

B. ESTRIN, Assistant Examiner

U.S. Cl. X.R.

317—234

PO-1050
(5/69)

UNITED STATES PATENT OFFICE
CERTIFICATE OF CORRECTION

Patent No. 3,500,143 Dated March 10, 1970

Inventor(s) JACK STEWART LAMMING

It is certified that error appears in the above-identified patent and that said Letters Patent are hereby corrected as shown below:

Column 2, line 62, "T" should be subscript.

Column 3, line 2, "transistor" should read --transition--.

"capacitance" should read --capacitances--.

Column 10, line 52, a comma was omitted after "30".

Column 12, line 14, "0.5μ" should read --0.15μ--.

Column 16, line 42, "and all the second base region parts." should read --surface portion is less than one micron.--

Signed and sealed this 8th day of September, 1970.

(SEAL)
Attest:

Edward M. Fletcher, Jr.
Attesting Officer

WILLIAM E. SCHUYLER, JR.
Commissioner of Patents